United States Patent
Landt et al.

(10) Patent No.: US 8,188,783 B1
(45) Date of Patent: May 29, 2012

(54) DEVICE AND SYSTEM FOR IMPLEMENTING OPTICALLY SOURCED ISOLATED SWITCH ELEMENTS

(75) Inventors: Don L. Landt, Palo, IA (US); Christopher Kalmar, Hiawatha, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 944 days.

(21) Appl. No.: 12/231,022

(22) Filed: Aug. 28, 2008

(51) Int. Cl.
*H01L 31/00* (2006.01)

(52) U.S. Cl. ........................................................ 327/514
(58) Field of Classification Search .................... 327/514
See application file for complete search history.

(56) References Cited

U.S. PATENT DOCUMENTS 7,268,706 B2 * 9/2007 Dally et al. .................. 341/58

* cited by examiner

*Primary Examiner* — Lincoln Donovan
*Assistant Examiner* — Daniel Rojas
(74) *Attorney, Agent, or Firm* — Donna P. Suchy; Daniel M. Barbieri

(57) ABSTRACT

A power amplifier comprising a distributed signal pre-driver, an AM Modulation Driver and a Switch Power Supply driving optically-powered and optically-switched GaN-based switches which are stacked and operated in a complementary fashion and are amplitude modulated using optically-powered and optically-switched charge pumps to produce the modulated rail voltages which in turn produces the desired AM signal modulation controlled by a high-speed feedback. The optically-coupled, isolated switching elements, OCIS, provide inherent isolation between switching devices and between stacked, switching devices and ground thus enabling true switch behavior of each switching element which is independent of the other elements and independent of the voltage conditions on the switched terminals. In the preferred embodiment most of the devices are formed using Aluminum-Gallium-Nitride/Gallium-Nitride HEMTs on a monolithic microwave integrated circuit device.

33 Claims, 1 Drawing Sheet

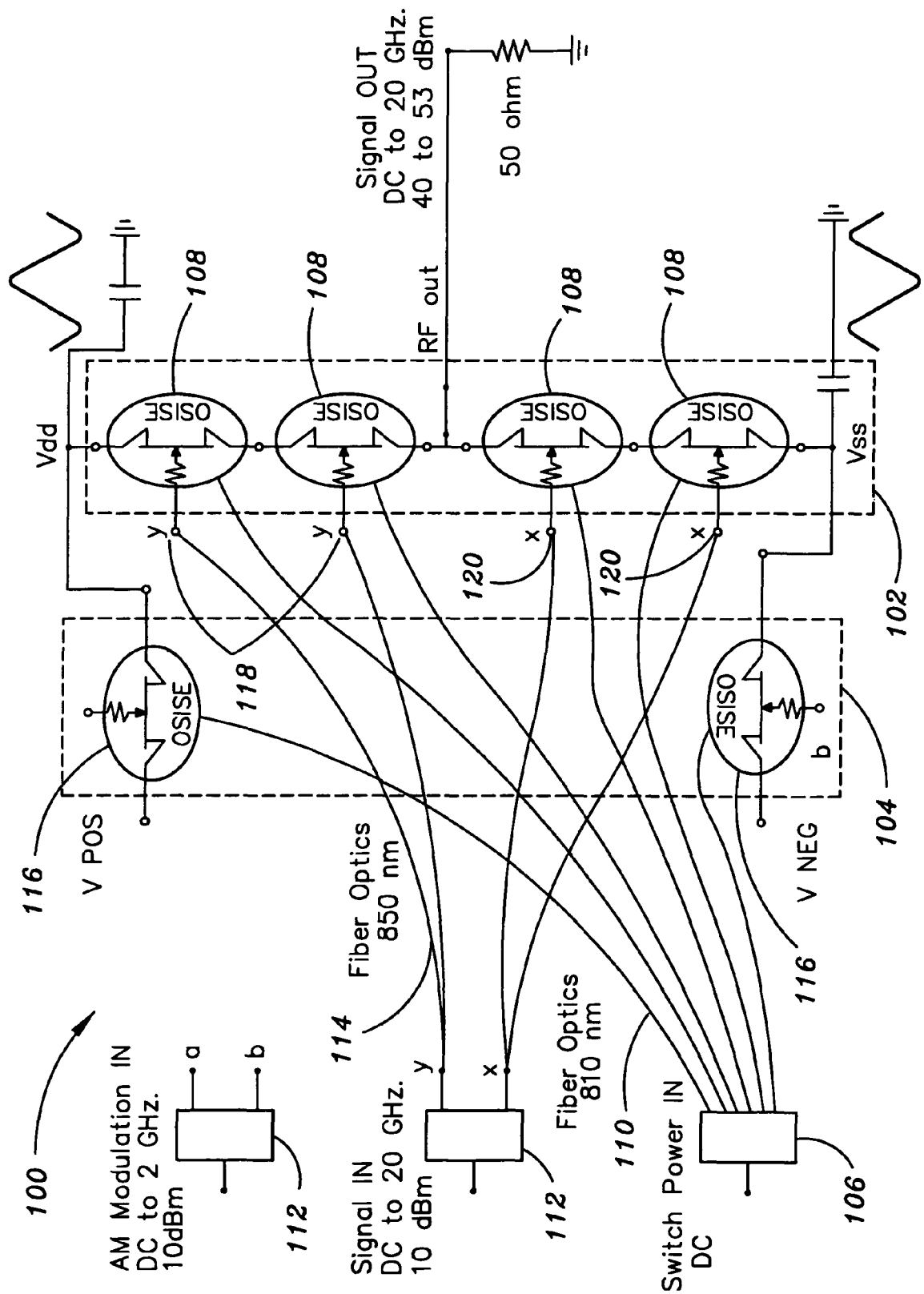

DEVICE AND SYSTEM FOR IMPLEMENTING OPTICALLY SOURCED ISOLATED SWITCH ELEMENTS

FIELD OF THE INVENTION

The present invention relates generally to power amplifiers. More specifically, the present invention relates to implementing power amplifiers using optically sourced isolated switch elements in a monolithic microwave integrated circuit.

BACKGROUND OF THE INVENTION

In microwave systems such as communication systems, microwave circuitry is often implemented in the form of what is commonly known as a microwave monolithic integrated circuit (MMIC). MMICs are a type of integrated circuit (IC) device that operates at microwave frequencies (1 GHz to 300 GHz). An MMIC device typically performs functions such as microwave mixing, power amplification, low noise amplification and high frequency switching. Inputs and outputs on MMIC devices are frequently matched to the standard 50 ohms.

One function performed by a MMIC device is power amplification. Typically, an MMIC device employs a group of FET based distributed amplifiers to provide broadband amplification. Many high-power RF and Microwave application, i.e. switched PAs, high-level mixers, TR switches, series FET PAs require switching elements that are capable of high voltages and currents, switch in extremely fast times, and are isolated from surrounding structures and devices.

As power and efficiency requirements increase, the problem becomes switching larger devices in shorter times and still maintaining the isolation between devices and supplies. The larger the devices the more internal capacitance from terminal to terminal and also more external capacitance from terminal to ground. Eventually, for very large devices the circuits become un-realizable.

Therefore, it is desirable to provide DC isolation solutions for use in switching circuit topologies which avoid isolation problems with high power output devices and enable independent switching of these high power devices irrespective of the bias condition on their switched terminals.

SUMMARY OF THE INVENTION

Accordingly, the various embodiments of the present invention are directed to optical sourced switching elements.

According, an embodiment of the present invention is directed to an integrated circuit. An integrated circuit comprises a switching circuit, wherein the switching circuit includes a first plurality of switching elements. Further, the integrated circuit includes a charge pump circuit; the charge pump circuit includes a second plurality of switching elements coupled to the switching circuit. Additionally, the integrated circuit includes a power supply, coupled to the first plurality of switching elements and to the second plurality of switching elements. The first plurality of switching elements and the second plurality of switching elements are optically coupled and optically powered.

A further embodiment of the present invention is directed to a system. The system includes a first integrated circuit; a first plurality of switching elements incorporated into the first integrated circuit; a second plurality of switching elements incorporated into the first integrated circuit; a power supply, operably coupled to the first plurality of switching elements and the second plurality of switching elements; a second integrated circuit positioned proximal to the first integrated circuit, wherein the first plurality of switching elements and the second plurality of switching elements comprise n-type devices and wherein the n-type devices provide isolation for first plurality of switching elements and the second plurality of switching elements.

In a further embodiment of the present invention another integrated circuit is disclosed. An integrated circuit comprising: a switching circuit, the switching circuit including a first plurality of switching elements; a charge pump circuit, the charge pump circuit including a second plurality of switching elements coupled to the switching circuit; and a power supply, coupled to the first plurality of switching elements and to the second plurality of switching elements; a signal converter, the signal converter operably coupled to the first plurality of switching elements the signal converter configured for providing a triggering signal to the first plurality of switching elements, wherein the first plurality and second plurality of switching elements are optically coupled and optically powered.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which:

FIG. 1 is a schematic diagram of an optically-triggered, optically-powered, isolated, switching elements (OSISE) according to an exemplary embodiment of the present invention;

DETAILED DESCRIPTION OF THE INVENTION

Reference will now be made in detail to presently preferred embodiments of the invention, examples of which are illustrated in the accompanying drawings.

The present invention addresses the need of many high-power RF and Microwave applications, i.e. switched power amplifiers (PA), high-level mixers, TR switched, series FET Pas, require switching elements that are capable of high voltages and currents, switch in extremely fast times and are isolated from surrounding structures and devices. As power and efficiency requirements increase, the problem becomes switching larger devices in shorter times and still maintaining the isolation between devices and supplies. The larger devices have more internal capacitance from terminal to terminal and also more external capacitance from terminals to ground. Eventually, for very large devices the circuits become un-realizable.

At higher frequencies, signals traveling on different paths can interfere with each other due to capacitive coupling between the paths or through electromagnetic radiation. Sometimes referred to as "crosstalk," it is especially severe when signal paths are not properly shielded or decoupled from each other. Crosstalk is particularly problematic when a weak signal is physically adjacent to a very strong signal. When maintaining signal-path isolation is critical, additional isolation measures should be used.

The use of wideband power amplifiers is limited in bandwidth and efficiency due to circuit limitations when matching large device capacitances over broad frequency ranges. A trade off between high efficiency, fast switching, and high-power defines the problem. Low power, IP3 devices are highly efficient with fast switching times, however with low power. Switching times can be maximized with the use of multi-stage devices; Darlingtons pairs, Cascode FETs, series FETs, and MMICs, however isolation in the biasing schemes and input drive schemes limits performance. Spatial combining of devices again lack isolation between devices and as a result incurs associated losses, limited bandwidth and does not provide true voltage or current combining.

The prior difficulties associated with implementation of high current, high-voltage switching elements at UHF thru X-Band occurred due to the lack of isolation between switch elements. In the present invention the switching elements are completely isolated with the use of optical coupling (vertical cavity side emitting laser, VCSEL to photovoltaic diode, PVD) for the RF and either magnetic coupling or optical coupling, (photonic power converter, PPC) for the DC biasing.

Referring generally to FIG. 1, an integrated circuit 100 is described in accordance with exemplary embodiments of the present invention. Referring specifically to FIG. 1, an integrated circuit 100 in accordance with an embodiment of the present invention is shown. The integrated circuit 100 provides for extremely fast switch times, high current and high voltage while maintaining isolation of switching elements from surrounding structures and devices. The integrated circuit 100 may operate as a complementary output stage similar to CMOS while using only n-type devices. The integrated circuit 100 is implemented within a power amplifier or a mixer and comprises a switching circuit 102. Further, the integrated circuit 100 may be a monolithic integrated circuit. The switching circuit 102 including a first plurality of switching elements 108. Further the first plurality of switching elements 108 may include at least one x switch 120 and at least on y switch 118. Further, the first plurality of switching elements 108 may be Gallium Nitride (GaN) based switches. Still further, the first plurality of switching element 108 may be optically powered via a first optical link 110. For example, the first optical link 110 may employ a fiber optic cable and operate at an optical wavelength of 810 nm. Further, the first plurality of switching elements 108 may be configured for optical link triggering. For example, the first plurality of switching elements 108 may be triggered by a signal from a second optical link 114. The second optical link 114 may employ a fiber optic cable and operate at an optical wavelength of 850 nm. Further, the first plurality of switching elements 108 may be pulled to the rail voltage $V_{dd}$ or $V_{ss}$ upon receiving a trigger via the second optical link 114.

The switching circuit 102 comprises a first plurality of switching elements 108. The first plurality of switching elements 108 may comprise Gallium Nitride (GaN) based switches. The first plurality of switching elements 108 includes at least one "X" switch and at least one "Y" switch. The "X" and "Y" switches correspond to a negative voltage and a positive voltage respectively. The first plurality of switching elements may be optically coupled between the ports. Further, the first plurality of switching elements may be optically powered. For example, the first plurality of switching elements may receive switching power via an 850 nm optical link 110. Further, the first plurality of switching elements 108 may be optically triggered via a triggering signal from a signal phase 112 supplied to the first plurality of switching elements vial an alternate high-speed, optical link 114 operating at an optical wavelength of 850 nm.

The "Y" switches including in the first plurality of switching elements are either off or pulled to the rail voltage $V_{dd}$. In a similar fashion, the "X" switches including int the first plurality of switching element are either off or pulled to the rail voltage $V_{ss}$.

The charging circuit 104 comprises a second plurality of switching elements 110. The second plurality of switching elements 116 includes at least one "A" switch and at least one "B" switch. The "A" and "B" switches included in the second plurality of switching elements may be configured as charge pumps for producing rail voltages $V_{dd}$ and $V_{ss}$ in sync with AM modulation. The "A" and "B" switches correspond to a positive voltage and a negative voltage respectively. The second plurality of switching elements 116 may receive power via an optical link. For example, the optical power link 110 may operate at an optical wavelength of 810 nm. Further, the second plurality of switching elements 116 may be optically coupled to the AM modulation Driver 122 with optical cable running at an optical frequency of 850 nm. A feedback loop from the $V_{dd}$ source to the AM Modulator Driver 122 would be implemented to maintain accurate control of the rail voltage and in turn the amplitude of the AM modulated signal. Still further the second plurality of switching elements 116 may be Gallium Nitride (GaN) based switches.

The power supply 106 consists of laser diodes driven from a DC switching power supply. The power supply 106 includes a power in port configured for converting one DC voltage level to another. The power supply 106 is configured for supplying power to the first plurality of switching elements and the second plurality of switching elements via an optical link. The power supply 106 may be configured with a plurality of independent optical links for supplying power to each of the first plurality of switching elements 108 and the second plurality of switching elements 116.

In one specific embodiment, the second plurality of switching elements 116 receives a carrier signal of DC to 2 Ghz via an optical link from port A on the AM Modulation Driver 122 to port A on the switching element 116. Utilizing AM Modulation Driver 122 the "A" switch included in the second plurality of switching elements 116 receives a pulse-width modulated signal that replicates the desired amplitude modulation of the signal on the $V_{dd}$ rail. The "B" switch included in the second plurality of switching elements 116 receives a pulse-width modulated signal that replicates a 180 degree out of phase signal of the desired amplitude modulation on the $V_{ss}$ rail.

Systems and apparatuses in accordance with various aspects of the present invention provide an improved integrated circuit. In this regard, the present invention may be described herein in terms of functional block components and various processing steps. It should be appreciated that such functional blocks may be realized by any number of hardware, firmware, and/or software components configured to perform the specified functions. For example, the present invention may employ various integrated circuit components, e.g., memory elements, digital signal processing elements, look-up tables, and the like, which may carry out a variety of functions under the control of one or more microprocessors or other control devices. Such general techniques and components that are known to those skilled in the art are not described in detail herein. Furthermore, although the invention is frequently described herein as pertaining to MMIC devices, it will be appreciated that the systems and methods described herein could also be applied to a D-class power amplifier.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

The invention claimed is:

1. An integrated circuit comprising:
   a switching circuit, the switching circuit including a first plurality of switching elements;
   a charge pump circuit, the charge pump circuit including a second plurality of switching elements coupled to the switching circuit; and
   a power supply, coupled to the first plurality of switching elements and to the second plurality of switching elements,
   wherein the first plurality and second plurality of switching elements are optically coupled and optically powered.

2. The integrated circuit of claim 1, wherein the first plurality of switching elements include at least one x switch and at least one y switch.

3. The integrated circuit of claim 1, wherein the integrated circuit operates as a complementary output stage using only n-type devices.

4. The integrated circuit of claim 1, wherein the first plurality of switching elements are Gallium Nitride (GaN) based switches.

5. The integrated circuit of claim 1, wherein the first plurality of switching elements is powered by a first optical link.

6. The integrated circuit of claim 1, wherein the second plurality of switching elements is powered by a first optical link.

7. The integrated circuit of claim 1, wherein the second plurality of switching elements is GaN based switches.

8. The integrated circuit of claim 1, wherein the first plurality of switching elements is triggered by a second optical link.

9. The integrated circuit of claim 1, wherein the second plurality of switching elements is configured to charge rail voltages $V_{dd}$ and $V_{ss}$.

10. The integrated circuit of claim 1, wherein the first plurality of switching elements are either off or pulled to the rail voltage $V_{dd}$ or $V_{ss}$.

11. The integrated circuit of claim 1, wherein the integrated circuit is a monolithic integrated circuit.

12. The integrated circuit of claim 1, wherein said first plurality of switching elements are configured for optical link triggering.

13. A system comprising:
   a first integrated circuit;
   a first plurality of switching elements incorporated into the first integrated circuit;
   a second plurality of switching elements incorporated into the first integrated circuit; and
   a power supply, the power supply optically coupled to supply power to the first plurality of switching elements and the second plurality of switching elements;
   a second integrated circuit positioned proximal to the first integrated circuit,
   wherein the first plurality of switching elements and the second plurality of switching elements comprise n-type devices and wherein the n-type devices provide isolation for first plurality of switching elements and the second plurality of switching elements.

14. The system of claim 13, comprising:
   at least one switch included in the second plurality of switching elements is configured for acting as a charge pump,
   wherein the charge pump produces rail voltages $V_{dd}$ and $V_{ss}$ in sync with AM modulation.

15. The system of claim 13, wherein said system is a monolithic integrated circuit.

16. The system of claim 13, wherein said first plurality of switching elements are configured for receiving a trigger via a first optical link.

17. The electrical device of claim 13, wherein said first plurality of switching elements are configured for receiving power via a second optical link.

18. The system of claim 13, wherein said second plurality of switching elements are configured for receiving power via a second optical link.

19. The electrical device of claim 13, wherein said first plurality of switching elements is configured for magnetic field coupling.

20. The electrical device of claim 13, wherein said plurality of switching elements is GaN based switches.

21. The system of claim 13, wherein said first plurality of switching elements are configured for optical coupling.

22. The system of claim 13, wherein said second plurality of switching elements are configured for optical coupling.

23. An integrated circuit comprising:
   a switching circuit, the switching circuit including a first plurality of switching elements;
   a charge pump circuit, the charge pump circuit including a second plurality of switching elements coupled to the switching circuit; and
   a power supply, coupled to the first plurality of switching elements and to the second plurality of switching elements;
   a signal converter, the signal converter operably coupled to the first plurality of switching elements the signal converter configured for providing a triggering signal to the first plurality of switching elements,
   wherein the first plurality and second plurality of switching elements are optically coupled and optically powered.

24. The integrated circuit of claim 23, wherein the first plurality of switching elements include at least one x switch and at least one y switch.

25. The integrated circuit of claim 23, wherein the integrated circuit operates as a complementary output stage using only n-type devices.

26. The integrated circuit of claim 23, wherein the first plurality of switching elements and the second plurality of switches comprise Gallium Nitride (GaN) based switches.

27. The integrated circuit of claim 23, wherein the first plurality of switching elements is powered by a first optical link.

28. The integrated circuit of claim 23, wherein the second plurality of switching elements is powered by a first optical link.

29. The integrated circuit of claim 23, wherein the first plurality of switching elements is triggered by a second optical link.

30. The integrated circuit of claim 23, wherein the second plurality of switching elements is configured to charge rail voltages $V_{dd}$ and $V_{ss}$.

31. The integrated circuit of claim 23, wherein the first plurality of switching elements are either off or pulled to the rail voltage $V_{dd}$ or $V_{ss}$.

32. The integrated circuit of claim 23, wherein the integrated circuit is a monolithic integrated circuit.

33. The integrated circuit of claim 23, wherein said first plurality of switching elements are configured for optical link triggering.

* * * * *